(12) United States Patent
Gaska et al.

(10) Patent No.: US 8,766,448 B2
(45) Date of Patent: Jul. 1, 2014

(54) CHROMIUM/TITANIUM/ALUMINUM-BASED SEMICONDUCTOR DEVICE CONTACT

(75) Inventors: Remigijus Gaska, Columbia, SC (US); Xuhong Hu, Lexington, SC (US); Michael Shur, Latham, NY (US)

(73) Assignee: Sensor Electronic Technology, Inc., Columbia, SC (US)

( * ) Notice: Subject to any disclaimer, the term of this patent is extended or adjusted under 35 U.S.C. 154(b) by 529 days.

(21) Appl. No.: 12/102,408

(22) Filed: Apr. 14, 2008

(65) Prior Publication Data
US 2008/0315419 A1  Dec. 25, 2008

Related U.S. Application Data

(60) Provisional application No. 60/937,054, filed on Jun. 25, 2007.

(51) Int. Cl.
    *H01L 23/532* (2006.01)
(52) U.S. Cl.
    USPC .... 257/763; 257/750; 257/765; 257/E29.144; 438/605
(58) Field of Classification Search
    USPC .............. 257/748, 750, 763, 765, E29.144; 438/605
    See application file for complete search history.

(56) References Cited

U.S. PATENT DOCUMENTS

| 4,963,440 A * | 10/1990 | Shimogori et al. ........... 428/651 |
| 5,563,422 A | 10/1996 | Nakamura et al. |
| 6,399,988 B1 * | 6/2002 | Yamazaki ..................... 257/344 |
| 6,653,215 B1 | 11/2003 | Brown et al. |
| 6,686,610 B2 | 2/2004 | Sheu |
| 2002/0145166 A1 * | 10/2002 | Kachelmeier ................. 257/368 |
| 2004/0056251 A1 * | 3/2004 | Kim et al. ........................ 257/72 |
| 2005/0224813 A1 * | 10/2005 | Liu et al. ......................... 257/79 |
| 2006/0270206 A1 | 11/2006 | Cho et al. |
| 2007/0102727 A1 * | 5/2007 | Twynam ....................... 257/194 |

FOREIGN PATENT DOCUMENTS

| JP | 01287625 A * | 11/1989 |
| JP | 2001196574 A | 7/2001 |
| KR | 100252947 B1 | 4/2000 |

OTHER PUBLICATIONS

Shao, G. et al. "On the omega Phase Formation in Cr-Al and Ti-Al-Cr Alloys." Acta Mater. 48 (2000) 3671-3685.*
Lee, J.K. et al. "Long-Term Oxidation Properties of Al-Ti-Cr Two-Phase Alloys as Coating Materials for TiAl Alloys." Intermetallics 10 (2002) 347-352.*
Schmitz et al.;Schottky barrier properties of various metals on n-type GaN; Semiconductor Science and Technology, vol. 11, No. 10, Oct. 1996. pp. 1464-1467.
Schmitz et al; Metal Contacts to n-Type GaN; Journal of Electronic Materials; vol. 27, No. 4, Apr. 1998, pp. 255-260.
Papanicolaou et al.; A High Temperature Vacuum Annealing Method for Forming Ohmic Contacts to GaN and SiC; Fourth International High Temperature Electronic Conference, Jun. 1998, pp. 122-127.

(Continued)

*Primary Examiner* — Tom Thomas
*Assistant Examiner* — Christopher M Roland
(74) *Attorney, Agent, or Firm* — LaBatt, LLC

(57) ABSTRACT

A contact to a semiconductor including sequential layers of Cr, Ti, and Al is provided, which can result in a contact with one or more advantages over Ti/Al-based and Cr/Al-based contacts. For example, the contact can: reduce a contact resistance; provide an improved surface morphology; provide a better contact linearity; and/or require a lower annealing temperature, as compared to the prior art Ti/Al-based contacts.

24 Claims, 8 Drawing Sheets

(56) References Cited

OTHER PUBLICATIONS

Papanicolaou et al.; Cr/Al and Cr/Al/Ni/Au ohmic contacts to n-type GaN; Journal of Applied Physics, vol. 87, No. 1, Jan. 2000, pp. 380-386.

PCT/US2008/067873; PCT International Search Report and Written Opinion; Feb. 27, 2009; 11 pages.

Mohammed et al., "Anatomy-performance correlation in Ti-based contact metallizations on AlGaN/GaN heterostructures", J. Appl. Phys. 101, Feb. 7, 2007, 15 pgs.

\* cited by examiner

CCD picture of Ti/Al-based contact for
280 nm UVLED

CCD picture of Cr/Ti/Al-based contact for
280 nm UVLED

CCD picture of Cr/Ti/Al-based contact for HFET

CCD picture of Ti/Al-based contact for HFET

CHROMIUM/TITANIUM/ALUMINUM-BASED SEMICONDUCTOR DEVICE CONTACT

REFERENCE TO PRIOR APPLICATIONS

The current application claims the benefit of co-pending U.S. Provisional Application No. 60/937,054, titled "Contact for semiconductor devices", which was filed on 25 Jun. 2007, and which is hereby incorporated by reference.

TECHNICAL FIELD

The disclosure relates generally to device contacts, and more particularly, to contacts for a semiconductor device, such as a Gallium Nitride semiconductor device.

BACKGROUND ART

The formation of a contact for a semiconductor device is an important process in fabricating the semiconductor device. For example, contact resistance significantly affects the performance characteristics of the semiconductor device. As a result, achieving a low contact resistance is typically desired. Other important characteristics include contact stability, surface morphology, reliability, and linearity, especially at large currents.

In order to achieve a low contact resistance for Gallium Nitride (GaN) devices, several contact metals and a relatively high annealing temperature are typically utilized to form the contact. Aluminum (Al) is widely used in ohmic contacts because of its low melting point of 660 degrees Celsius. Additionally, Titanium (Ti) or Chromium (Cr) is used as the first layer for the contact because of its low metal work function to GaN. For example, one approach forms a Ti/Al-based contact to an n-type GaN semiconductor having several metals, such as Ti/Al/Ti/Gold (Au) or Ti/Al/Nickel (Ni)/Au, a thickness from five nanometers to five microns, and which is annealed at 400 degrees Celsius or more. A different approach reverses the order of Ti and Al, and forms an Al/Ti-based contact to an n-type GaN semiconductor that includes Al/Ti/Platinum (Pt)/Au and is annealed at temperatures between 400 and 600 degrees Celsius. Other approaches form a Cr/Al-based contact to an n-type GaN semiconductor that include various metal configurations, such as Cr/Al/Cr/Au, Cr/Al/Pt/Au, Cr/Al/Lead (Pd)/Au, Cr/Al/Ti/Au, Cr/Al/Cobalt (Co)/Au, and Cr/Al/Ni/Au.

To date, a Ti/Al-based contact yields a lower contact resistance than a Cr/Al-based contact, while requiring a higher temperature annealing for the contact alloy. However, the Ti/Al-based n-contact is not reliable for 265 nanometer (nm) and shorter wavelength ultraviolet (UV) light emitting diodes (LEDs). The Cr/Al-based contact has a lower annealing temperature, but a higher contact resistance, than the Ti/Al-based contact. Because of the lower annealing temperature, the surface morphology of the Cr/Al-based contact is better than that of the Ti/Al-based contact.

Various research has been devoted to improving the Ti/Al-based contacts and the Cr/Al-based contacts.

SUMMARY OF THE INVENTION

Aspects of the invention provide a novel Cr/Ti/Al-based contact to a semiconductor, which includes sequential layers of Cr, Ti, and Al. In an embodiment, a contact including a Cr/Ti/Al alloy is provided, which can result in a contact that provides numerous advantages, including at least some of those of the prior art Ti/Al-based and Cr/Al-based contacts. The resulting contact can have one or more advantages over Ti/Al-based and Cr/Al-based contacts. For example, the contact can: reduce a contact resistance; provide an improved surface morphology; provide a better contact linearity; and/or require a lower annealing temperature, as compared to the prior art Ti/Al-based contacts.

A first aspect of the invention provides a contact to a semiconductor comprising: Chromium; Titanium directly on the Chromium; and Aluminum directly on the Titanium.

A second aspect of the invention provides a semiconductor device comprising: a semiconductor structure having an exposed surface and a semiconductor below the exposed surface; and a contact to the semiconductor, the contact including: Chromium over the exposed surface; Titanium directly on the Chromium; and Aluminum directly on the Titanium.

A third aspect of the invention provides a method of fabricating a semiconductor device, the method comprising: obtaining a semiconductor structure having an exposed surface and a semiconductor below the exposed surface; and forming a contact to the semiconductor, the contact including: Chromium over the exposed surface; Titanium directly on the Chromium; and Aluminum directly on the Titanium.

A fourth aspect of the invention provides an integrated circuit comprising: a first semiconductor device including: a semiconductor structure having an exposed surface and a semiconductor below the exposed surface; and a first contact to the semiconductor, the first contact including: Chromium over the exposed surface; Titanium directly on the Chromium; and Aluminum directly on the Titanium; and a second device having a second contact, wherein the first contact provides an interconnect to the second contact.

Other aspects of the invention provide methods, systems, and methods of using and generating each, which include and/or implement some or all of the actions described herein. The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

It is noted that the drawings are not to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a novel Cr/Ti/Al-based contact to a semiconductor, which includes sequential layers of Cr, Ti, and Al. In an embodiment, a contact including a Cr/Ti/Al alloy is provided, which can result in a contact with the combined advantages of the prior art Ti/Al-based and Cr/Al-based contacts. The resulting contact can have one or more advantages over Ti/Al-based and Cr/Al-based contacts. For example, the contact can: reduce a contact resistance; provide an improved surface morphology; provide a better contact linearity; and/or require a lower annealing temperature, as compared to the prior art Ti/Al-based contacts. As used herein, unless otherwise noted, the phrase "any solution" means any now known or later developed solution.

Figure 1A:
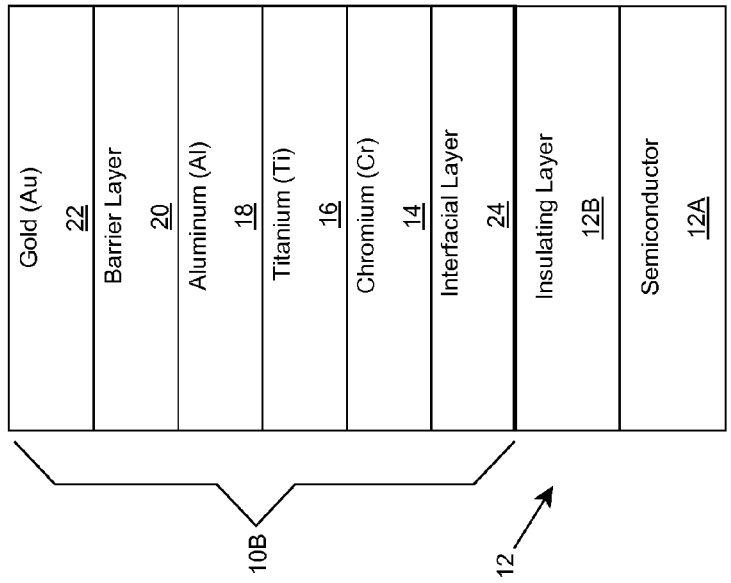
FIGS. 1A-B show illustrative contacts according to embodiments.
Figure 1B:
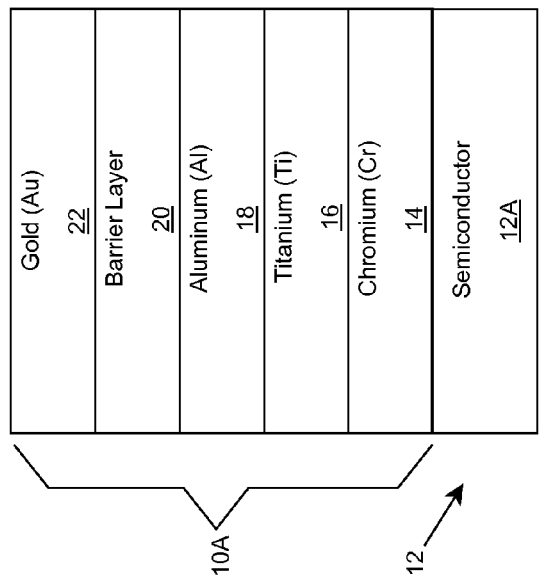

Turning to the drawings, FIGS. 1A-B show illustrative contacts 10A-B, respectively, according to embodiments. As illustrated, contacts 10A-B are formed on an exposed surface of a semiconductor structure 12. Semiconductor structure 12 can comprise at least one layer that comprises a semiconductor 12A. For example, semiconductor structure 12 can comprise one or more layers/regions of: a binary, ternary, or quaternary group III-V material (e.g., AlN, GaN, InN, and/or the like) or alloy(s) thereof; diamond; any carbon modification; silicon carbide (including all polytypes or mixtures thereof); silicon; germanium; a silicon germanium alloy; and/or the like. Further, semiconductor structure 12 may include one or more layers/regions of insulating material, metals, and/or the like. The precise configuration of layers/regions can be selected to obtain desired operating characteristic(s) of a resulting semiconductor device using any solution. In an embodiment, semiconductor 12A comprises an n-type semiconductor material. In a further embodiment, the n-type semiconductor material is a GaN-based semiconductor material, such as AlGaN, an AlGaN/GaN heterostructure, or the like. In a still further embodiment, semiconductor 12A can comprise a layer, such as an AlGaN layer, having a high Al composition.

Each contact 10A-B is a contact to semiconductor 12A, which is disposed below contact 10A-B. Contact 10A or 10B can be formed directly on an exposed surface of semiconductor 12A as illustrated by contact 10A in FIG. 1A. Alternatively, contact 10A or 10B can be formed on an exposed surface of a layer that is disposed between semiconductor 12A and contact 10A or 10B. To this extent, as illustrated by contact 10B in FIG. 1B, contact 10A or 10B can comprise a contact to a metal-insulator semiconductor structure. In particular, contact 10A or 10B can be formed on an insulating layer 12B, which is disposed between semiconductor 12A and contact 10B. Insulating layer 12B can comprise any type of insulating material, such as silicon dioxide, silicon nitride, aluminum oxide, aluminum nitride, and/or the like. Alternatively, another type of layer can separate contact 10A or 10B from semiconductor 12A, such as a thin semiconductor layer or the like. An illustrative thin semiconductor layer can comprise a thin layer of aluminum nitride, silicon, or the like.

In any event, contacts 10A-B can be formed on an exposed surface of a layer (semiconductor, insulating, or the like) of semiconductor structure 12 using any solution. For example, semiconductor structure 12 having the exposed surface can be obtained using any solution (e.g., manufactured, purchased, prepared, and/or the like). Subsequently, contact 10A can be formed on the exposed surface using any solution. For example, Chromium 14 can be deposited directly on the exposed surface using any solution, Titanium 16 can be deposited directly on Chromium 14, and Aluminum 18 can be deposited directly on Titanium 16. Additionally, a barrier layer 20 can be formed (e.g., deposited) directly on Aluminum 18, and Gold 22 can be deposited directly on barrier layer 20. Barrier layer 20 can comprise any metal, such as Titanium, Chromium, Nickel, Cobalt, Platinum, Lead, or the like. The thickness of each metal in contact 10A can vary between approximately 10 Angstroms and approximately 1 micron.

Similarly, contact 10B can be formed on an exposed surface of semiconductor structure 12 using any solution. For example, an interfacial layer 24 can be formed (e.g., deposited) directly on the exposed surface using any solution, Interfacial layer 24 can provide an insulating layer on which contact 10B is formed. Interfacial layer 24 can comprise a semi-metal, a semiconductor having an energy gap that is smaller than an energy gap of the material to which contact 10B is made (e.g., semiconductor 12A), an amorphous material, a doped semiconductor, and/or the like. In an embodiment, interfacial layer 24 comprises aluminum gallium nitride. Interfacial layer 24 can have a thickness between approximately 10 Angstroms and approximately 1 micron. The remainder of contact 10B can be formed on interfacial layer 24 in the same manner as described for contact 10A.

Either contact 10A-B can comprise an ohmic contact or a Schottky contact. Additionally, either contact 10A-B can comprise a contact to a p-type or n-type semiconductor 12A. Further, the formation of contact 10A-B can include annealing the contact 10A-B to improve the contact performance. In an embodiment, the annealing is performed at a temperature between approximately 500 degrees Celsius and approximately 1100 degrees Celsius, and will vary based on the composition of semiconductor structure 12, among other factors.

Contact 10A-B and semiconductor structure 12 can be implemented as part of various types of semiconductor devices using any solution. To this extent, contact 10A-B can be used in wide band gap semiconductor technology and semiconductor devices, such as those used in microwave amplifiers, oscillators, switchers, and/or the like, as well as optoelectronic devices. For example, illustrative types of devices include a light emitting diode (LED), a laser, a field effect transistor (FET), a solar cell, a charge coupled device, a Schottky diode, a p-n junction diode, and/or the like. Further, a device fabricated with contact 10A-B can be implemented in an integrated circuit, in which contact 10A-B provides an interconnect to a contact for another device in the circuit.

The contact described herein has been implemented on several devices using several alternative embodiments and evaluated with respect to prior art Ti/Al-based contacts. The evaluation has shown that embodiments of the contact can: reduce a contact resistance; provide an improved surface morphology; provide a better contact linearity; and/or require a lower annealing temperature, as compared to the prior art Ti/Al-based contacts.

For example, when implemented as a contact to an AlGaN semiconductor with a relatively high molar fraction of Al (e.g., a molar fraction of Al that is more than 50%), an embodiment of the contact described herein can reduce a contact resistance and/or provide a more uniform contact resistance than a Ti/Al-based contact. The AlGaN semiconductor with a relatively high molar fraction of Al is commonly used for deep Ultraviolet (UV) LEDs that emit electromagnetic radiation having a wavelength between approximately 255 nm and 265 nm.

Figure 2:
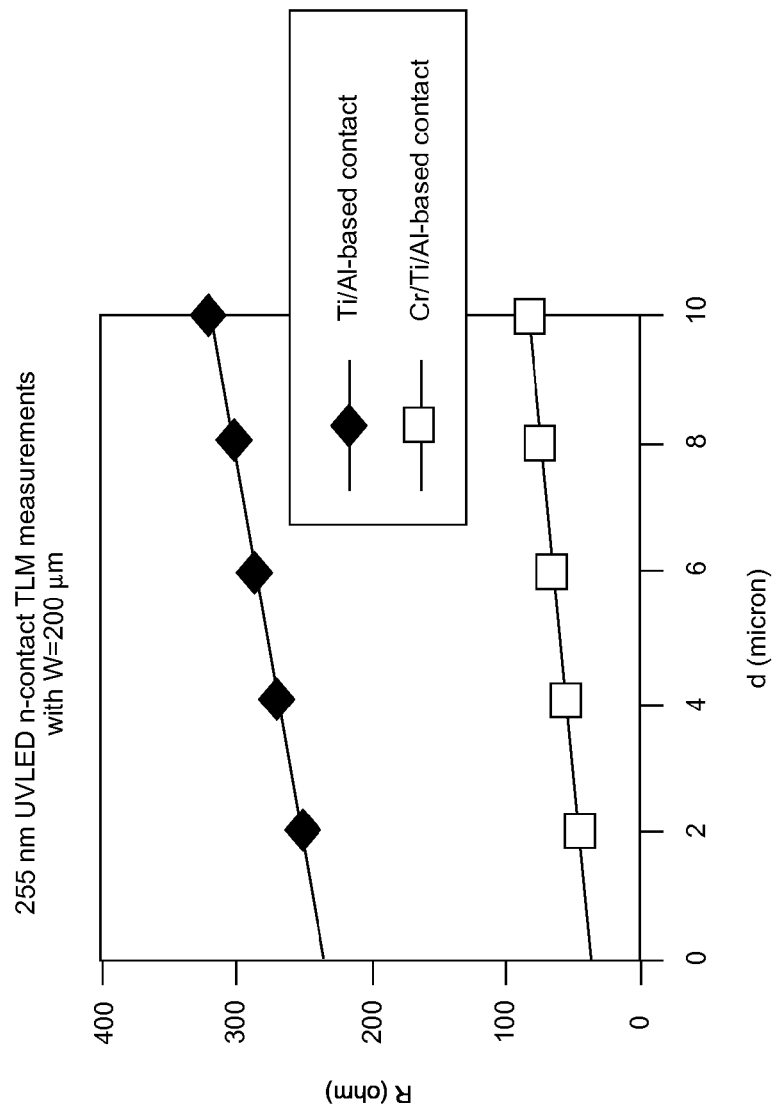
FIG. 2 shows illustrative n-contact transmission line method (TLM) measurement results of a 255 nm UV LED having a width (W) of 200 µm according to an embodiment.
Figure 3:
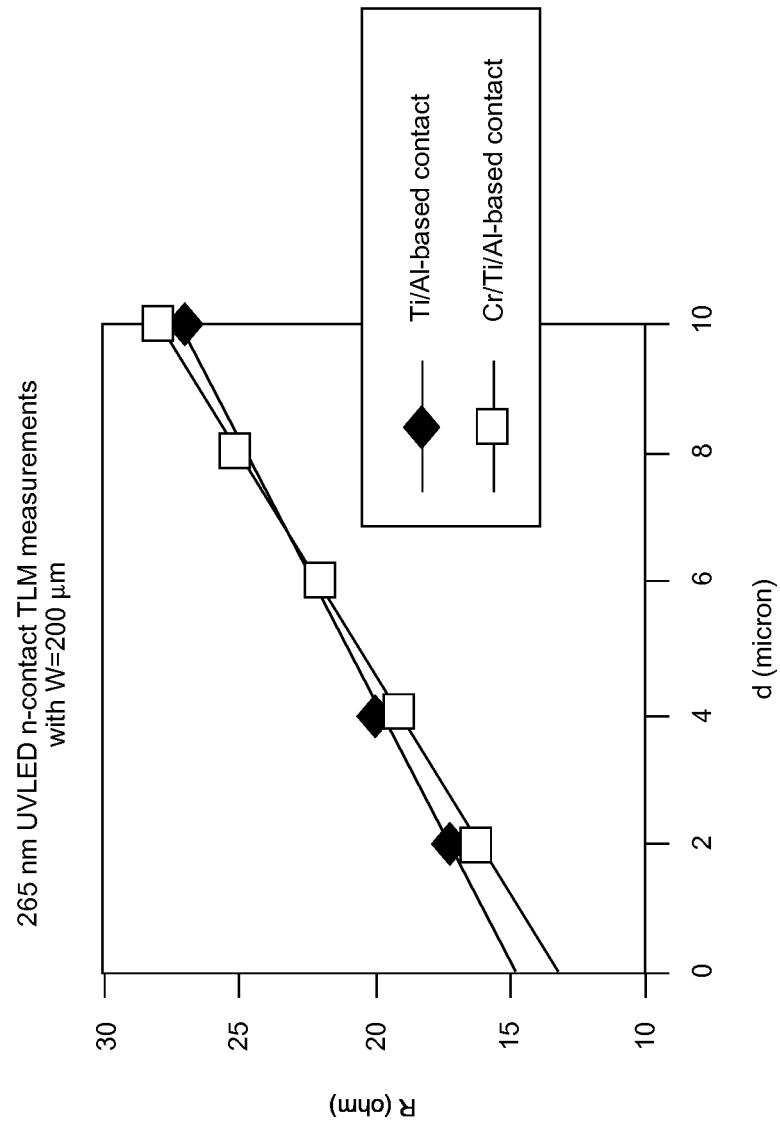
FIG. 3 shows illustrative n-contact TLM measurement results of a 265 nm UV LED having a width (W) of 200 µm according to an embodiment.
Figure 4:
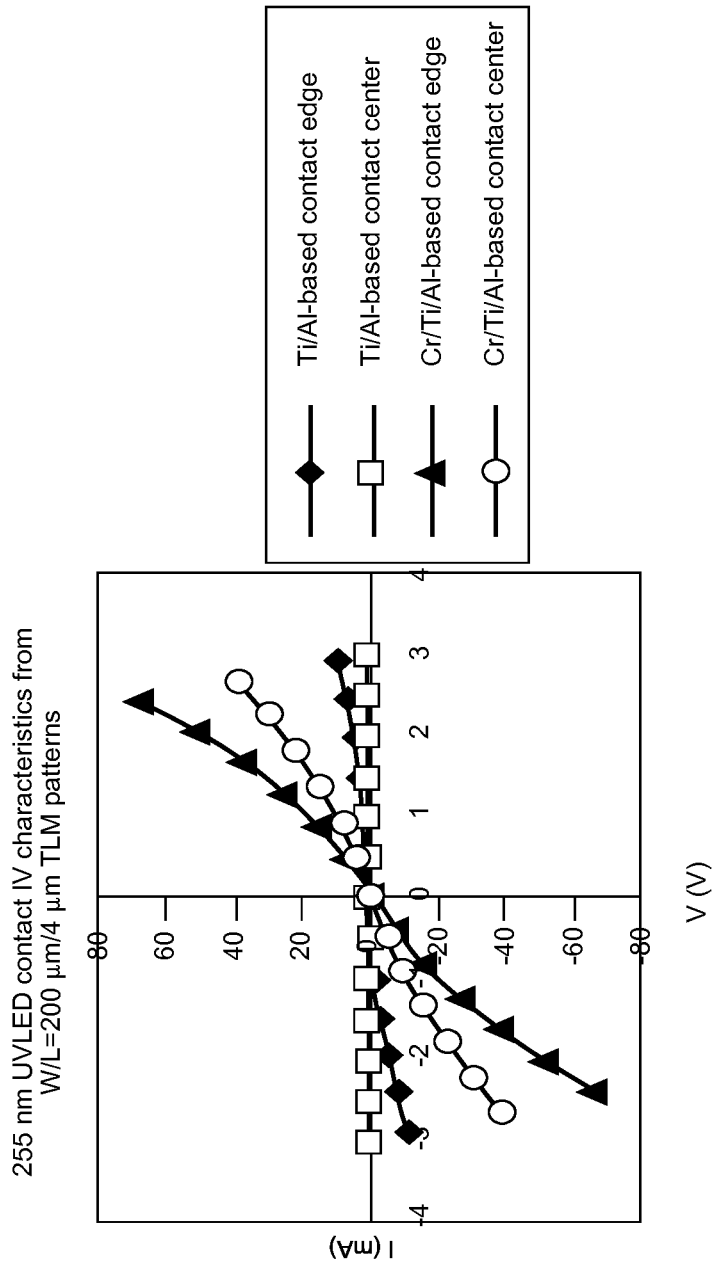
FIG. 4 shows illustrative n-contact edge and center TLM current-voltage (IV) characteristic measurements for a 255 nm UV LED having a width/length (W/L) of 200 µm/4 µm according to an embodiment.

To this extent, FIG. 2 shows illustrative n-contact TLM measurement results of a 255 nm UV LED having a width (W) of 200 μm according to an embodiment. As illustrated, the n-contact resistivity was approximately 3.6 Ω-mm for the Cr/Ti/Al-based contact, and approximately 23.4 Ω-mm for the Ti/Al-based contact. To this extent, the Cr/Ti/Al-based contact reduced the contact resistance by approximately 84.6%. FIG. 3 shows illustrative n-contact TLM measurement results of a 265 nm UV LED having a width (W) of 200 μm according to an embodiment. In this case, the n-contact resistivity was approximately 1.3 μ-mm for the Cr/Ti/Al-based contact and approximately 1.5 Ω-mm for the Ti/Al-based contact, which results in an approximately 13.3% reduction in contact resistance. Additionally, FIG. 4 shows illustrative n-contact edge and center TLM IV characteristic measurements for a 255 nm UV LED having a width/length (W/L) of 200 μm/4 μm according to an embodiment. As illustrated, the resistance of an embodiment of the Cr/Ti/Al-based contact is more uniform than that of the Ti/Al-based contact.

Figure 5:
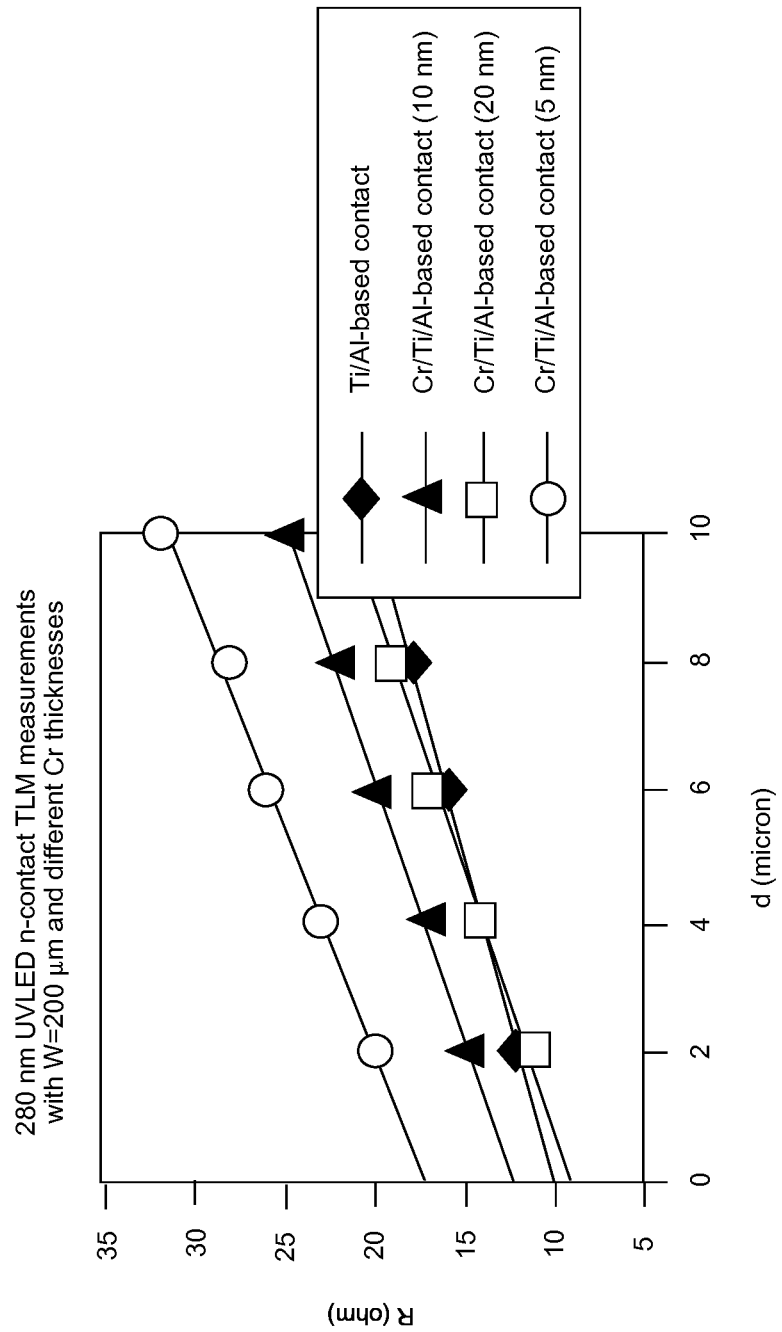
FIG. 5 shows illustrative n-contact TLM measurement results of a 280 nm UV LED having a width (W) of 200 µm and different Cr thicknesses according to embodiments.

For UV LEDs that emit radiation having a wavelength between approximately 265 nm and 295 nm, the contact resistance for an embodiment of Cr/Ti/Al-based contact was similar to the contact resistance for Ti/Al-based contacts. For example, as shown in FIG. 3, the Cr/Ti/Al-based contact provided a slight improvement in contact resistance for a Ti/Al-based contact for a 265 nm UV LED. FIG. 5 shows illustrative n-contact TLM measurement results of a 280 nm UV LED having a width (W) of 200 μm and different Cr thicknesses according to embodiments. As illustrated, the contact resistivity is approximately: 1.7 Ω-mm for a Cr thickness of 5 nm; 1.2 for a Cr thickness of 10 nm; and 0.9 for a Cr thickness of 20 nm. While the contact resistivity improved with the Cr thickness, the 20 nm Cr thickness requires a longer annealing time.

Figure 6A:
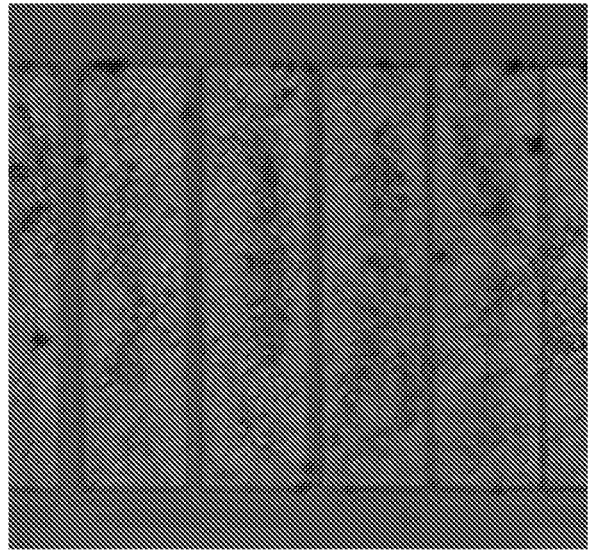
FIGS. 6A-B show illustrative CCD pictures of Ti/Al-based contacts and Cr/Ti/Al-based contacts, respectively, for a 280 nm UV LED according to an embodiment.
Figure 6B:
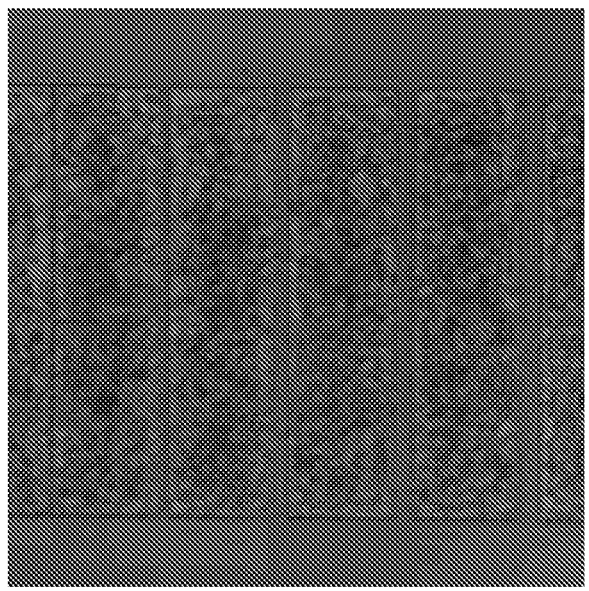

The annealing temperature for embodiments of the Cr/Ti/Al-based contact are also similar to that of Ti/Al-based n-contacts for 265 nm to 295 nm UV LEDs. However, embodiments of the Cr/Ti/Al-based contact showed an improved surface morphology over that of a Ti/Al-based contact. To this extent, FIGS. 6A-B show illustrative CCD pictures of Ti/Al-based contacts and Cr/Ti/Al-based contacts, respectively, for a 280 nm UV LED according to an embodiment. As illustrated, the image of the Cr/Ti/Al-based contacts (FIG. 6B) is a lighter color than the image of the Ti/Al-based contacts (FIG. 6A). The lighter color results from more reflected light from a more uniform surface. This is an indication of improved morphology of the Cr/Ti/Al-based contacts over that of the Ti/Al-based contacts.

For n-GaN-based blue LEDs, the annealing temperature is between 400 degrees Celsius to 600 degrees Celsius for Ti/Al-based contacts. However, a higher Al composition in UV LEDs requires a higher annealing temperature for forming an ohmic contact. For example, for n-type AlGaN UV LEDs that emit radiation having a wavelength between approximately 330 nm and 365 nm, a Ti/Al-based contact requires an annealing temperature of approximately 850 degrees. Embodiments of the Cr/Ti/Al-based n-contacts for 330 nm to 365 nm UV LEDs require a lower annealing temperature, e.g., approximately 700 degrees Celsius. For low-Al concentration AlGaN materials, such as those used in green LEDs, blue LEDs, and in field effect transistors, both the Ti/Al-based and Cr/Ti/Al-based contacts give satisfactory results.

Table 1 below compares the annealing temperatures for Ti/Al and Cr/Ti/Al-based contacts to AlGaN with different molar fractions of Aluminum (e.g., in UV LEDs generating radiation of different wavelengths). Similarly, Table 2 compares the contact resistances of Ti/Al and Cr/Ti/Al-based contacts to AlGaN with different molar fractions of Aluminum. As illustrated, Cr/Ti/Al-based contacts have lower resistances compared to Ti/Al-based contacts for deep UV LEDs (255-265 nm). The advantage is more pronounced for shorter wavelengths. Additionally, the Cr/Ti/Al-based contacts have lower annealing temperatures compared to Ti/Al-based contacts for longer wavelength UV LEDs (330-365 nm). Still further, the current-voltage (IV) characteristics of Cr/Ti/Al yield a low contact resistance for all researched UV LEDs (e.g., 255-365 nm).

TABLE 1 n-contact anneal temperatures

| | Wavelength | | | | | |
|---|---|---|---|---|---|---|
| | 365 nm | 340 nm | 295 nm | 280 nm | 265 nm | 255 nm |
| Ti/Al-contact | 850° C. | 850° C. | 900° C. | 900° C. | 900° C. | 950° C. |
| Cr/Ti/Al-contact | 700° C. | 700° C. | 900° C. | 900° C. | 900° C. | 950° C. |

TABLE 2 n-contact resistance

| | Wavelength | | | | | |
|---|---|---|---|---|---|---|
| | 365 nm | 340 nm | 295 nm | 280 nm | 265 nm | 255 nm |
| Ti/Al-contact (Ω · mm) | 0.18 | 0.24 | 0.56 | 1.00 | 1.5 | 23.4 |
| Cr/Ti/Al-contact (Ω · mm) | 0.75 | 0.49 | 0.78 | 1.23 | 1.3 | 3.6 |

Figure 7:
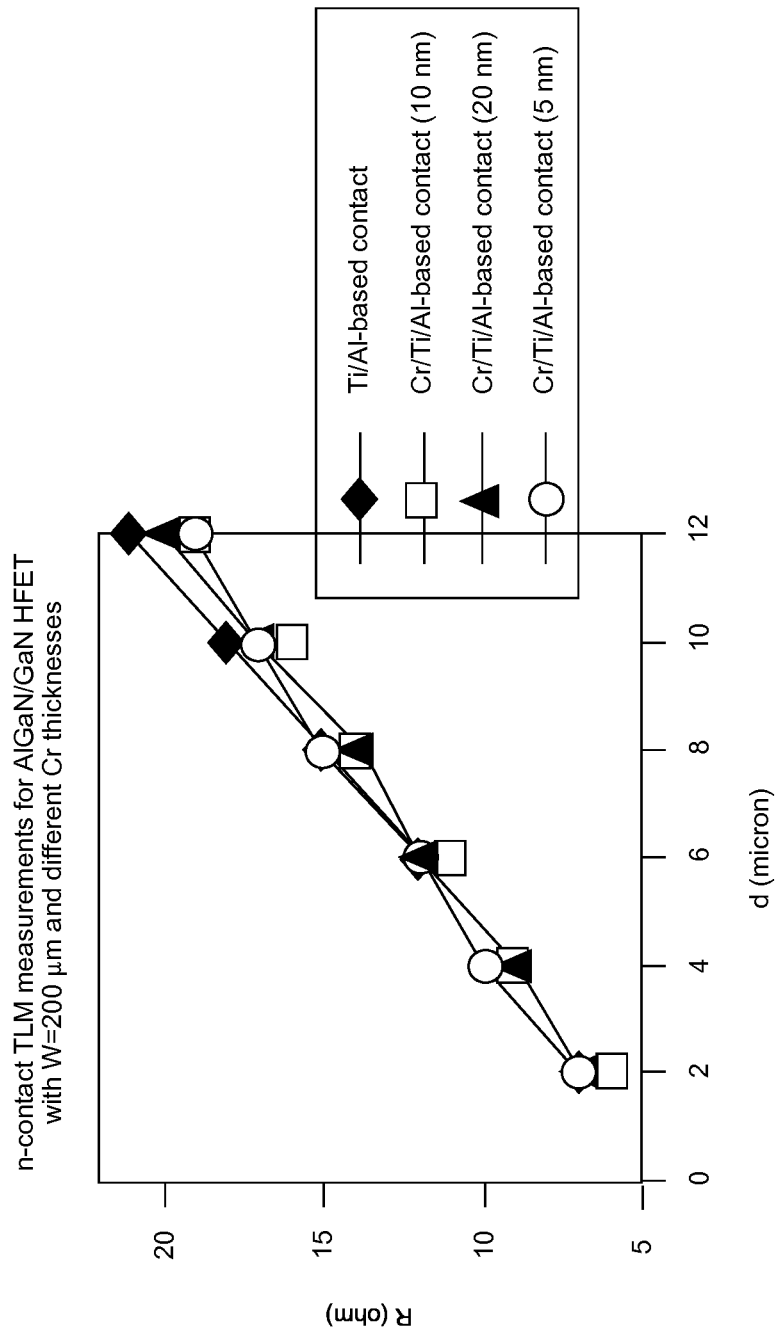
FIG. 7 shows illustrative n-contact TLM measurement results for a field effect transistor having a width (W) of 200 µm and different Cr thicknesses according to embodiments.

As previously described, the Cr/Ti/Al-based contact can be implemented on various types of devices in addition to UV LEDs. For example, embodiments of the Cr/Ti/Al-based contact have been used for an AlGaN/GaN HFET n-contact process. To this extent, FIG. 7 shows illustrative n-contact TLM measurement results for a field effect transistor having a width (W) of 200 μm and different Cr thicknesses according to embodiments. As illustrated, the contact resistivity is approximately: 0.5 Ω-mm for a Cr thickness of 5 nm; 0.36 for a Cr thickness of 10 nm; and 0.4 for a Cr thickness of 20 nm. While the contact resistance could be smaller than that of the Ti/Al-based contact, any difference is not large.

Figure 8B:
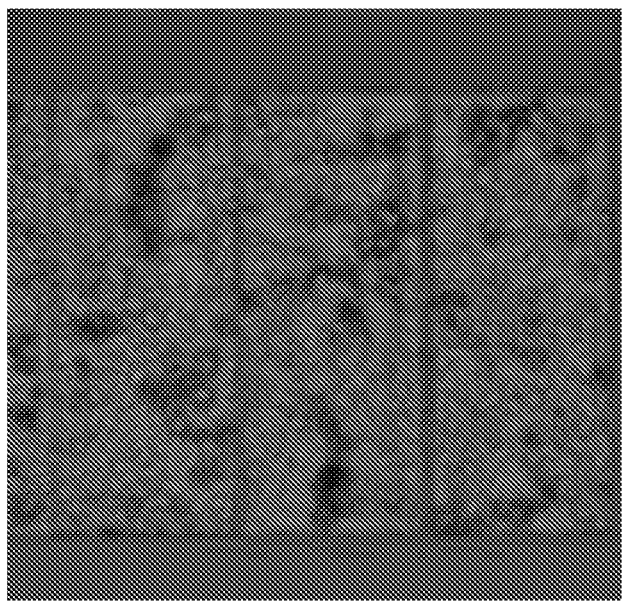
FIGS. 8A-B show illustrative charge-coupled device (CCD) pictures of Ti/Al-based contacts and Cr/Ti/Al-based contacts, respectively, for a heterostructure field effect transistor (HFET) according to an embodiment.
Figure 8A:
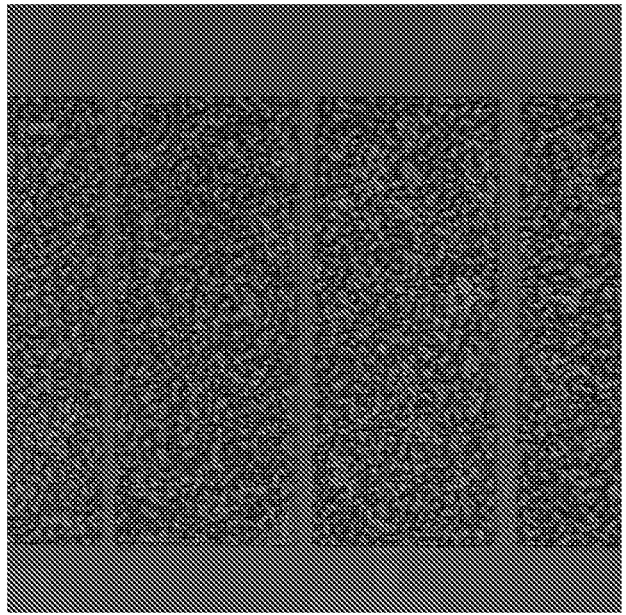

However, the Cr/Ti/Al-based contact can provide an improved alloy morphology over that of Ti/Al contacts due to the lower annealing temperature. For example, FIGS. 8A-B show illustrative CCD pictures of Ti/Al-based contacts and Cr/Ti/Al-based contacts, respectively, for an HFET according to an embodiment. As illustrated, the image of the Cr/Ti/Al-based contacts (FIG. 8B) is a lighter color than the image of the Ti/Al-based contacts (FIG. 8A). The lighter color results from more reflected light from a more uniform surface. This is an indication of improved morphology of the Cr/Ti/Al-based contacts over that of the Ti/Al-based contacts.

Further, as previously discussed with reference to FIG. 4, the contact resistance (e.g., voltage divided by current) for Cr/Ti/Al-based contact is more uniform from edge to center than that of the Ti/Al-based contact. As a result of the better contact quality, a device, such as an HFET or a UV LED, including Cr/Ti/Al-based contact(s) may have an improved thermal stability for the contact(s) and an improved operational lifetime as compared to that provided by the Ti/Al-based contact(s).

While primarily shown and described as a contact and a semiconductor device, it is understood that the invention provides a method of fabricating such a contact and/or semiconductor device. For example, as shown in FIGS. 1A-B, the semiconductor device can be fabricated by obtaining a semiconductor structure 12 having an exposed surface and a semiconductor 12A below the exposed surface and forming contact 10A or 10B to semiconductor 12A on the exposed surface. As described herein, contact 10A or 10B includes Chromium over the exposed surface, Titanium directly on the Chromium, and Aluminum directly on the Titanium. Either contact 10A-B can include one or more additional metals/layers, which can be formed using any solution. Further, the formation of contact 10A or 10B can include annealing the contact, e.g., at a temperature between approximately 500 degrees Celsius and approximately 1100 degrees Celsius. Formation of the semiconductor device can include various additional known steps/processes, which are not described herein for clarity.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A device comprising:
   a contact to a semiconductor, wherein the contact is formed by a method comprising:
      forming a multi-layer structure comprising:
         the semiconductor;
         a metal layer of Chromium over the semiconductor;
         a metal layer of Titanium directly on the Chromium; and
         a metal layer of Aluminum directly on the Titanium; and
      annealing the multi-layer structure.

2. The device of claim 1, the multi-layer structure further comprising a barrier layer directly on the Aluminum.

3. The device of claim 2, the barrier layer comprising at least one of: Titanium, Chromium, Nickel, Cobalt, Platinum, or Lead.

4. The device of claim 2, the multi-layer structure further comprising Gold directly on the barrier layer.

5. The device of claim 1, the contact further comprising an interfacial layer, wherein the Chromium is directly on the interfacial layer.

6. The device of claim 5, wherein the interfacial layer comprises one of: a semi-metal, a semiconductor, an amorphous material, or a doped semiconductor.

7. The device of claim 1, wherein the contact is an n-type ohmic contact.

8. A semiconductor device comprising:
   a group III-nitride-based semiconductor structure having an exposed surface and a group III-nitride-based semiconductor below the exposed surface; and
   a contact to the group III-nitride-based semiconductor, the contact formed by a method including:
      forming a multi-layer structure comprising:
         the group III-nitride-based semiconductor;
         a metal layer of Chromium over the exposed surface;
         a metal layer of Titanium directly on the Chromium; and
         a metal layer of Aluminum directly on the Titanium; and
      annealing the multi-layer structure.

9. The device of claim 8, the multi-layer structure further including:
   a barrier layer directly on the Aluminum; and
   Gold directly on the barrier layer.

10. The device of claim 8, the contact further including an interfacial layer directly on the exposed surface, wherein the Chromium is directly on the interfacial layer.

11. The device of claim 10, wherein the interfacial layer is a semiconductor having an energy gap that is smaller than an energy gap of the semiconductor.

12. The device of claim 8, wherein the contact is an ohmic contact.

13. The device of claim 8, wherein the contact is a Schottky contact.

14. The device of claim 8, wherein the exposed surface is a surface of an insulating layer.

15. The device of claim 8, wherein the exposed surface is a surface of the semiconductor.

16. The device of claim 8, wherein the group III-nitride-based semiconductor is an Aluminum Gallium Nitride (AlGaN)-based material.

17. The device of claim 8, wherein the device is one of: a light emitting diode, a laser, a field effect transistor, a solar cell, a charge coupled device, a Schottky diode, or a p-n junction diode.

18. A method of fabricating a semiconductor device, the method comprising:
   obtaining a group III-nitride-based semiconductor structure having an exposed surface and a group III-nitride-based semiconductor below the exposed surface; and
   forming a contact to the group III-nitride-based semiconductor, the contact forming including:
      forming a multi-layer structure comprising:
         the group III-nitride-based semiconductor;
         a metal layer of Chromium over the exposed surface;
         a metal layer of Titanium directly on the Chromium; and
         a metal layer of Aluminum directly on the Titanium; and
      annealing the multi-layer structure.

19. The method of claim 18, wherein the contact is an ohmic contact.

20. The method of claim 18, wherein the annealing is performed at a temperature between approximately 500 degrees Celsius and approximately 1100 degrees Celsius.

21. The method of claim 18, the multi-layer structure forming including:
   depositing the Chromium over the exposed surface;
   depositing the Titanium directly on the Chromium; and
   depositing the Aluminum directly on the Titanium.

22. The method of claim 18, the multi-layer structure forming including:
   depositing a barrier layer directly on the Aluminum; and
   depositing Gold directly on the barrier layer.

23. The method of claim 18, the contact forming further including:
   forming an interfacial layer directly on the exposed surface, wherein the Chromium is directly on the interfacial layer.

24. The method of claim 18, wherein the exposed surface is a surface of one of: the semiconductor or an insulating layer over the semiconductor.

* * * * *